United States Patent [19]

Culling

[11] Patent Number: 5,539,362

[45] Date of Patent: Jul. 23, 1996

[54] SURFACE MOUNTED DIRECTIONAL COUPLER

[75] Inventor: Michael J. Culling, Cambridge, England

[73] Assignee: Harris Corporation, Melbourne, Fla.

[21] Appl. No.: 497,237

[22] Filed: Jun. 30, 1995

[51] Int. Cl.⁶ .................................................. H01P 5/18
[52] U.S. Cl. ............................................ 333/116; 333/238
[58] Field of Search ................................................ 333/116

[56] References Cited

U.S. PATENT DOCUMENTS

| | | | |
|---|---|---|---|
| 4,027,254 | 5/1977 | Gunton et al. | 333/116 X |
| 4,394,630 | 7/1983 | Kenyon et al. | 333/116 |
| 4,823,097 | 4/1989 | Konishi et al. | 333/116 |
| 5,373,266 | 12/1994 | Lenzing et al. | 333/116 |
| 5,486,798 | 1/1996 | Veitschegger | 333/116 |

Primary Examiner—Paul Gensler
Attorney, Agent, or Firm—Tarolli, Sundheim, Covell, Tummino & Szabo

[57] ABSTRACT

A microwave directional coupler comprises a coupler dielectric board which is mounted substantially perpendicular to the surface of a parent circuit board. Upper interdigital elements are disposed on opposing surfaces of the coupler dielectric board. The coupling between the upper interdigital elements determines the odd mode impedance $Z_{oo}$ of the microwave directional coupler. Lower interdigital elements are also disposed on opposing surfaces of the coupler dielectric board. The lower interdigital elements are connected to ground and are arranged so that coupling between the lower interdigital elements and the upper interdigital elements determines the even mode impedance $Z_{oe}$ of the microwave directional coupler.

14 Claims, 4 Drawing Sheets

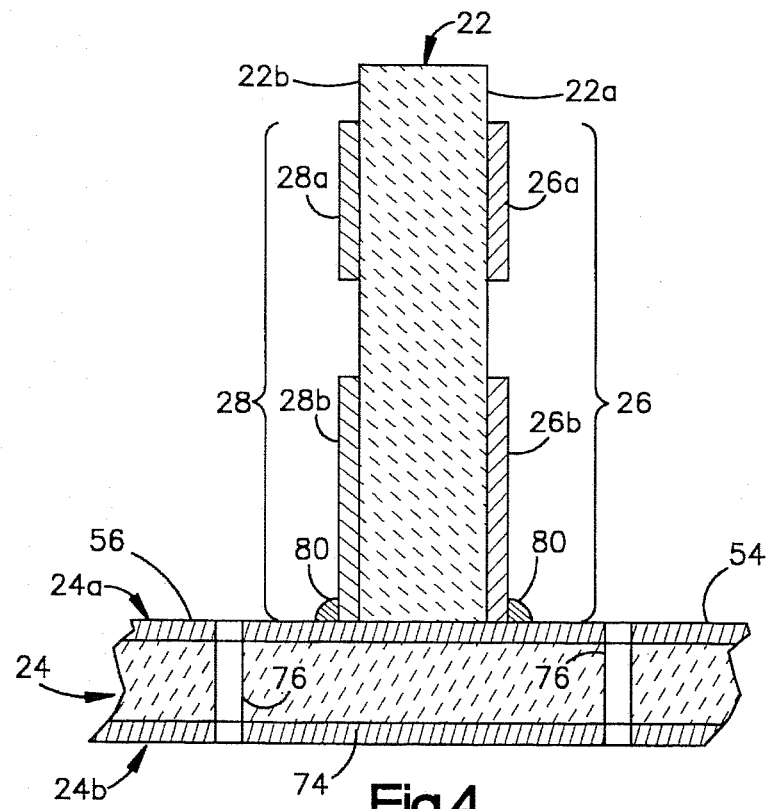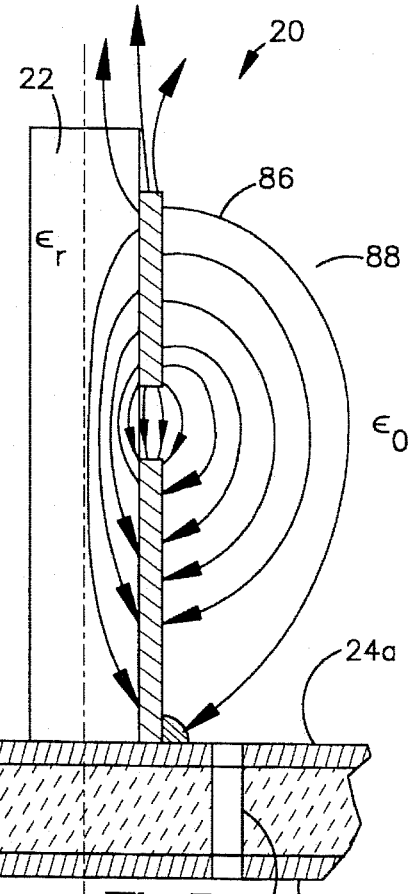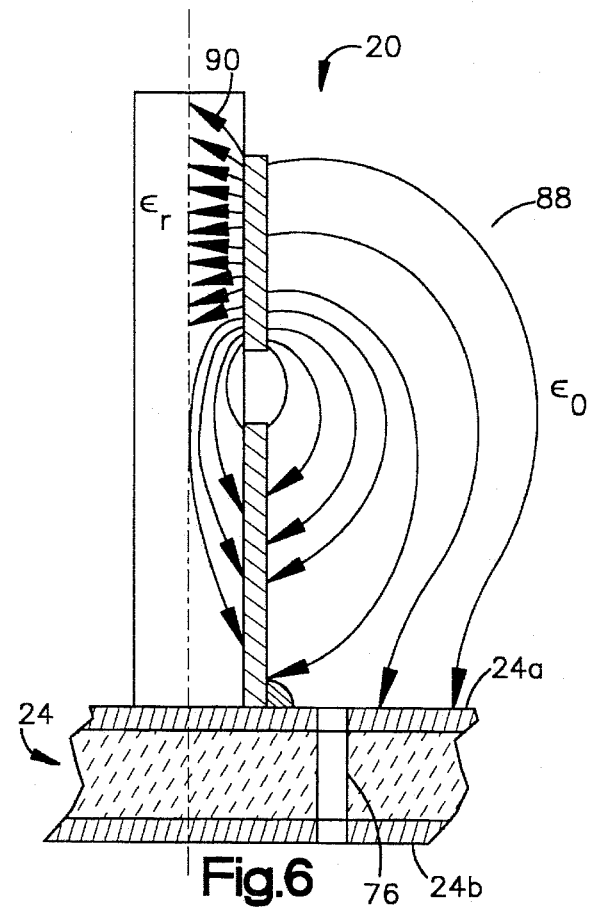

SURFACE MOUNTED DIRECTIONAL COUPLER

BACKGROUND OF THE INVENTION

1. Technical Field

The present invention relates generally to a microwave directional coupler, and specifically to such a coupler having interdigital coupling line elements disposed on opposing sides of a dielectric substrate which determine the even and odd mode impedances of the coupler independent of the parent circuit board on which the coupler is mounted.

2. Description of the Prior Art

A microwave directional coupler is a four port microwave device used as a power divider or combiner. The four ports are designated Port 1, Port 2, Port 3, and Port 4. When a signal is input to Port 1, it is coupled into Ports 2 and 3 but not into Port 4. A signal input to Port 4 is similarly coupled into Ports 2 and 3 but not into Port 1. Because there is no coupling between Ports 1 and 4, these ports are known as uncoupled or isolated ports relative to each other. Signals may also be input, or result from reflections, in Ports 2 and 3. A signal input to Port 2 is coupled to Ports 1 and 4 but not to Port 3, while a signal input to Port 3 is coupled to Ports 1 and 4 but not to Port 2. Thus, Ports 2 and 3 are isolated ports relative to each other.

A typical application for a directional coupler is in a radar system for monitoring transmitter power. In a radar system, the radar transmitter is connected to Port 1 of the directional coupler. The antenna is then connected to Port 2, a microwave power detector to Port 3, and Port 4 is terminated in a matched load. With this configuration, any impedance mismatch of the antenna will not result in the reflected power propagating into Port 2 being measured in Port 3 as power output of the transmitter. This is true because Ports 2 and 3 are isolated ports and a signal input to Port 2 is not coupled to Port 3.

A microstrip directional coupler is disclosed in U.S. Pat. No. 4,823,097 to Konishi et al. The coupler comprises a first dielectric board which stands erect on the upper surface of a parent dielectric board. A coupling line part is disposed on each side of the first dielectric board. Lead lines are disposed on the upper surface of the parent dielectric board and are connected to both ends of each coupling line part. A ground plane is formed by a conductive layer disposed on the lower surface of the parent dielectric board. This physical construction results in the even and odd mode impedances of the coupler being determined by both coupling between the coupling line parts and by coupling between each coupling line part and the ground plane. Because the impedances are determined in part by coupling to the ground plane, the composition and physical dimensions of the parent dielectric board affect the impedances. Therefore, the design of the coupler requires knowledge and consideration of the type of parent dielectric board on which the first dielectric board will be mounted.

Another embodiment of a microstrip directional coupler is disclosed in U.S. Pat. No. 5,373,266 to Lenzing et al. This coupler is comprised of a pair of microstrip coupling elements having remote edges which are straight and adjacent edges which follow curved paths having reversals in curvature such as sinusoidal or half circle patterns. The coupling elements are disposed on one surface of a dielectric substrate. A ground plane conducting layer is disposed on the opposite surface of the dielectric substrate. In this coupler, the even mode impedance is formed by coupling between the straight remote edges of the microstrip coupling elements and the ground plane. Therefore, the composition and physical dimensions of the single dielectric substrate affect the coupler even mode impedance and thus the coupler design.

A directional coupler including comb electrodes having an elongated bus bar with a plurality of spaced teeth is disclosed in U.S. Pat. No. 4,394,630 to Kenyon et al. In one embodiment, a first comb electrode is disposed on one side of a dielectric substrate and a second comb electrode is disposed on the other side of the dielectric substrate. A generally rectangular hollow conductor encases and supports the dielectric substrate. A filling material having predetermined dielectric characteristics is used to fill the volume between the one side of the dielectric substrate and the adjacent side of the hollow rectangular conductor. In the same way, a filling material is used to fill the volume between the other side of the dielectric substrate and the adjacent side of the hollow rectangular conductor. The even and odd mode impedances of the coupler are determined by the composition and physical dimensions of both the dielectric substrate and the filling material.

A drawback common to these prior art couplers is that the conductor line patterns which form the coupling elements are required to be printed on the parent printed circuit board containing the other peripheral electronic circuitry. A design conflict arises in this situation where the directional coupler may require an expensive dielectric material to achieve the required performance while a cheaper material would suffice for the peripheral circuitry. Because the coupler and the peripheral circuitry are contained on the same circuit board, the use of an expensive material for the entire board is required to meet coupler design criteria.

A further disadvantage in prior art couplers is where coupling is produced from structures having mixed dielectrics or where the fields are contained in media having different permittivity values. The different permittivity values produce differing phase velocities of the fields which result in non-optimum coupler directivity. Further, it is known by those skilled in the art that other effects which limit the performance of directional couplers are so called "end effects", where discontinuities occur between the unbalanced feed connections and the balanced coupled lines. Additionally, in view of increasing trends toward automated component placing and reflow soldering, some coupler types do not lend themselves to automated assembly and manual assembly is required.

SUMMARY OF THE INVENTION

The present invention is directed to a microwave directional coupler which is mounted to a parent circuit board. The coupler comprises a coupler dielectric board which is mounted substantially perpendicular to the surface of the parent circuit board. Upper interdigital elements are disposed on opposing surfaces of the coupler dielectric board. Electrical coupling between the upper interdigital elements determines the odd mode impedance $Z_{oo}$ of the microwave directional coupler. Lower interdigital elements are also disposed on opposing surfaces of the coupler dielectric board. The lower interdigital elements are connected to ground and are arranged so that electrical coupling between the lower interdigital elements and the upper interdigital elements determines the even mode impedance $Z_{oe}$ of the microwave directional coupler.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein:

FIG. 4 is a cross-sectional view of the microwave directional coupler;

FIG. 5 is a cross-sectional view of the microwave directional coupler showing the electric field associated with the even mode impedance $Z_{oe}$;

FIG. 6 is a cross-sectional view of the microwave direction coupler showing the electric field associated with the odd mode impedance $Z_{oo}$;

DESCRIPTION OF PREFERRED EMBODIMENT

Figure 1:
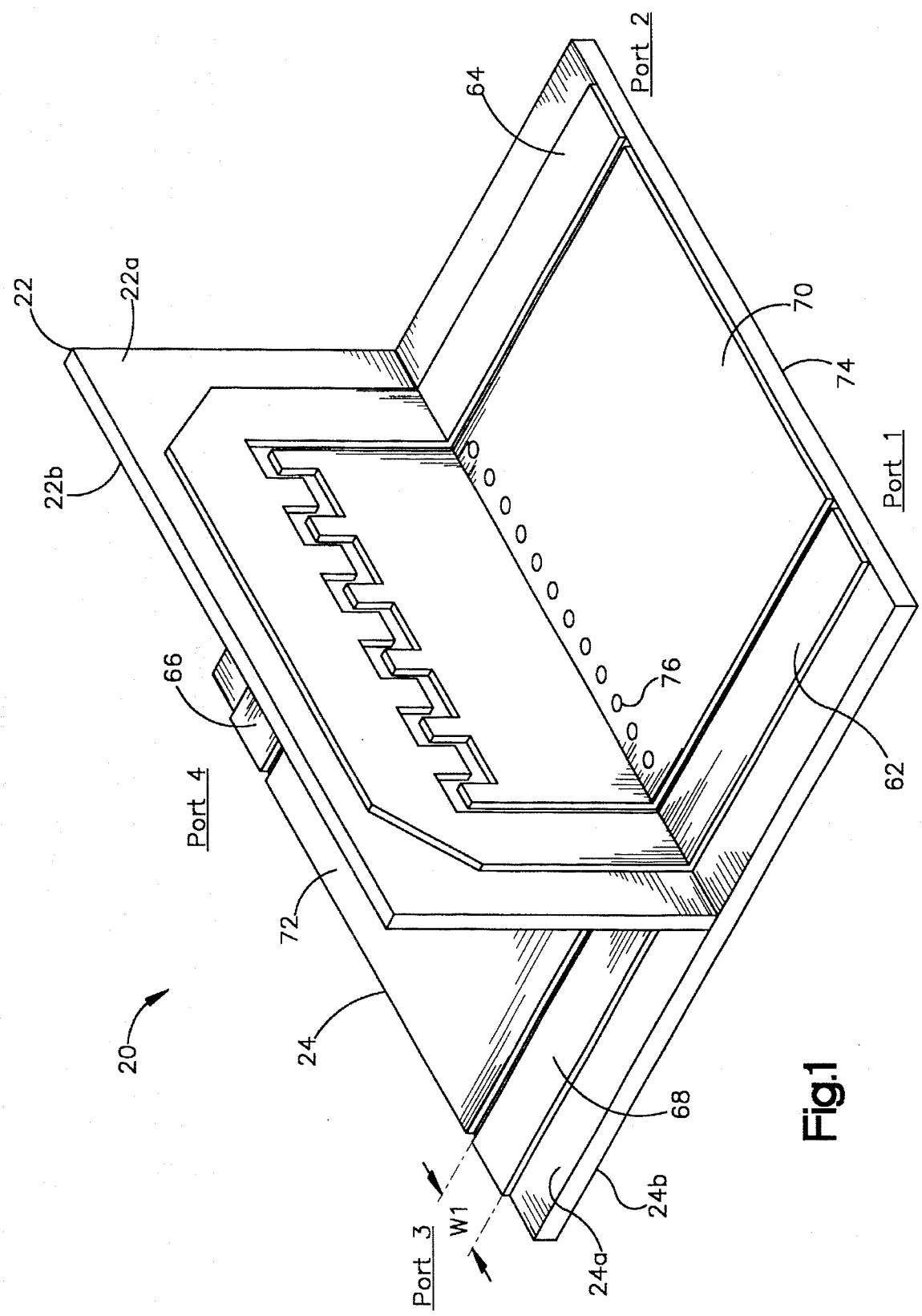
FIG. 1 is a microwave directional coupler in accordance with the present invention.
Figure 2:
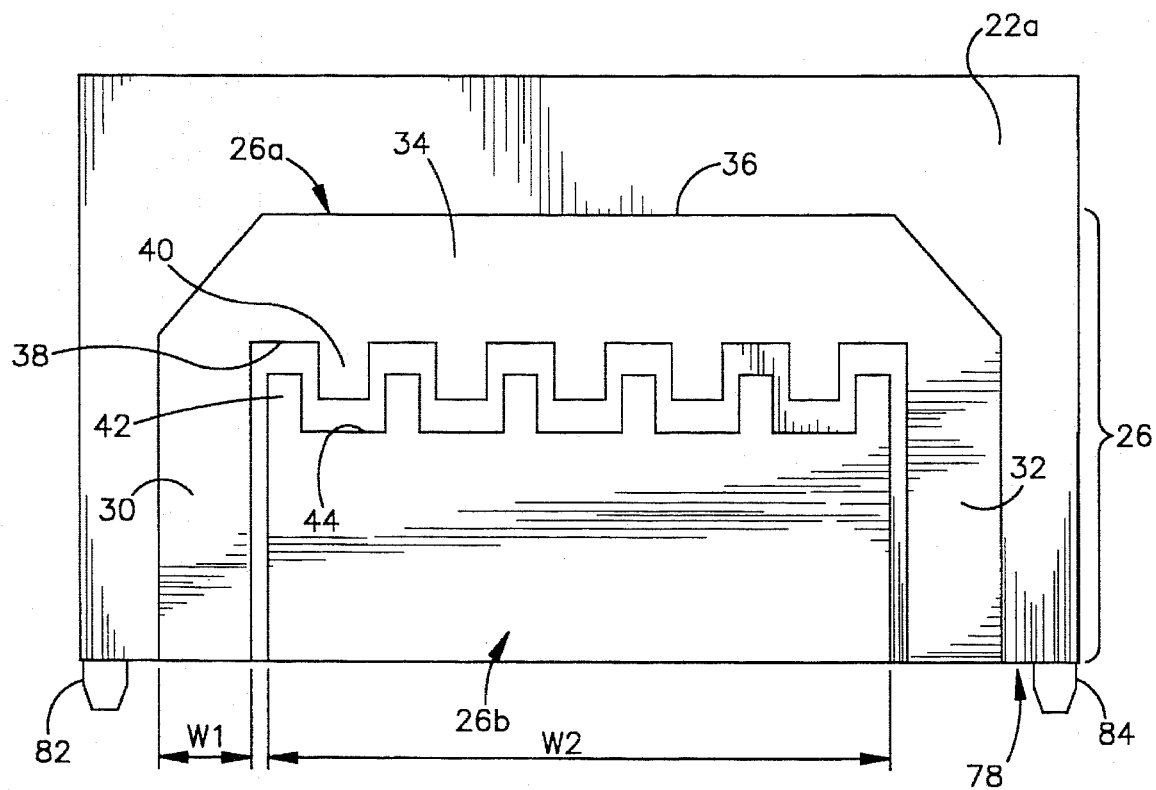
FIG. 2 is a side view of one side of the coupler dielectric board 22 of FIG. 1.
Figure 3:
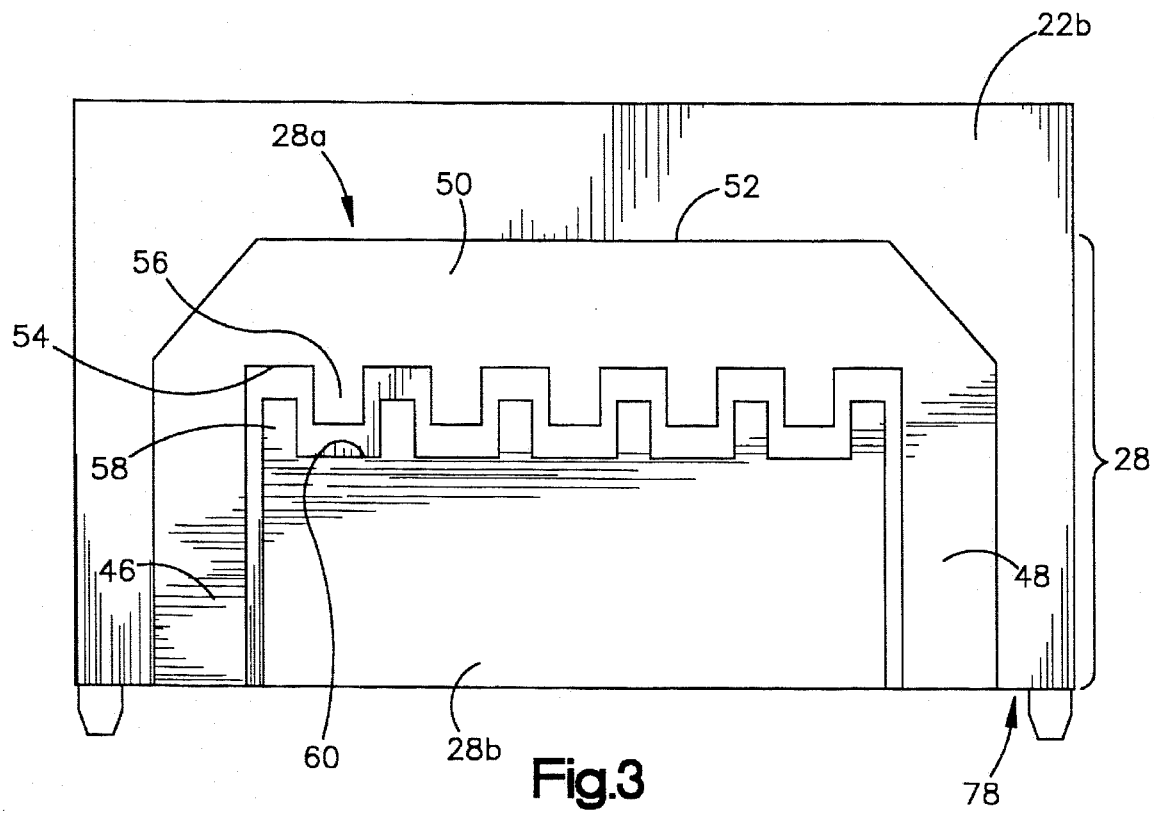
FIG. 3 is a side view of the other side of the coupler dielectric board 22 of FIG. 2.

A microwave directional coupler 20 in accordance with the present invention is shown in FIGS. 1–4. The coupler 20 includes a coupler dielectric board 22 having planar surfaces 22a and 22b. The coupler 20 is mounted on a parent circuit board 24 having planar surfaces 24a and 24b. The coupler 20 is mounted with its planar surfaces 22a and 22b normal to the planar surfaces 24a and 24b of the parent circuit board 24. Although not shown in FIGS. 1–4, other peripheral circuitry associated with the circuit in which the coupler 20 is being used is also mounted on the parent circuit board 24.

The coupler 20 includes interdigitated coupling elements 26 and 28 disposed on surfaces 22a and 22b, respectively. The interdigitated coupling element 26 includes an upper interdigital element 26a and a lower interdigital element 26b. The upper interdigital element 26a comprises two side sections 30 and 32 each connected to one end of a longitudinal section 34 having a predetermined length and width. The longitudinal section 34 has a straight upper edge 36 and a lower edge 38 having teeth 40. Interdigitated with the teeth 40 are teeth 42 formed on an upper edge 44 of the lower interdigital element 26b.

The interdigitated coupling element 28 is symmetrically disposed on the planar surface 22b. The interdigitated coupling element 28 includes an upper interdigital element 28a and a lower interdigital element 28b. The upper interdigital element 28a comprises two side sections 46 and 48 each connected to one end of a longitudinal section 50 having a predetermined length and width. The longitudinal section 50 has a straight upper edge 52 and a lower edge 54 having teeth 56. Interdigitated with the teeth 56 are teeth 58 formed on an upper edge 60 of the lower interdigital element 28b.

While the coupling elements 26 and 28 are shown and described as being symmetrical, this need not be true. For example, the widths of the upper interdigital elements 26a and 28a can be different to adjust the desired coupling factor of the coupler 20. The lengths of both the upper interdigital elements 26a and 28a and the lower interdigital elements 26b and 28b (shown as W2 in FIG. 2) are also adjusted. These lengths are scaled as a function of the desired operating frequency of the coupler 20.

The interdigitated coupling elements 26 and 28 are formed by etching the surfaces of the coupler dielectric board 22 in accordance with photographic masters which have been produced to a very high degree of accuracy. Prior to etching, the surface of the coupler dielectric board 22 is covered on its planar surfaces 22a and 22b by a layer of rolled or electro-deposited copper film. Registration marks added to the photographic masters ensure a high degree of back-to-front registration of the patterns.

There are also conductive traces which must be disposed on the parent circuit board 24 to facilitate the mounting of the coupler 20. On the planar surface 24a of the parent circuit board 24 are disposed four conductive traces 62, 64, 66, and 68. The traces 62, 64, 66, and 68 provide direct connection to the sections 30, 32, 46, and 48, respectively, with minimal end effects. This provides good impedance matching between a conductive trace and its associated side section. In addition to the conductive traces 62, 64, 66, and 68, two ground planes 70 and 72 are also disposed on the planar surface 24a of the parent circuit board 24. The ground planes 70 and 72 are made the same width W2 as the lower interdigital coupling elements 26b and 28b. A lower ground plane 74 is disposed on the planar surface 24b of the parent circuit board 24. Each ground plane 70 and 72 is connected to this lower ground plane 74 by a plurality of vias 76. The lower ground plane 74 is connected to system ground potential, and the vias 76 result in the ground planes 70 and 72 also being at system ground potential.

The directional coupler 20 is connected to the parent circuit board 24 by soldering the conductor traces disposed on the coupler dielectric board 22 to those disposed on the parent circuit board. The side sections 30 and 32 are soldered at lower edge 78 of the coupler dielectric board 22 to the conductive traces 62 and 64, respectively. The side sections 46 and 48 are likewise soldered at lower edge 78 to the conductive traces 66 and 68, respectively. The lower interdigital coupling element 26b is soldered at lower edge 78 to the ground plane 70 while the lower interdigital coupling element 28b is soldered at lower edge 78 to the ground plane 72. All these solder connections form fillet solder joints 80. Other methods such as a suitable conductive adhesive may be used in place of the fillet solder joints 80.

Proper mechanical alignment of the coupler dielectric board 22 during soldering or other means of connection is accomplished by the use of mounting pegs 82 and 84. Each of the mounting pegs 82 and 84 fits into an associated mounting hole (not shown) on the parent circuit board 24. The use of the mounting pegs 82 and 84 for alignment, and the use of fillet solder joints 80 for mechanical and electrical connection should be easily automated using known "pick-and-place" assembly techniques.

The electrical characteristics of the directional coupler 20 are determined by the coupling factor C of the coupler. When currents of equal magnitude are flowing in the same direction in both the upper interdigital coupling elements 26a and 28a, an even mode impedance designated $Z_{oe}$ exists between each element and ground. Similarly, when currents of equal magnitude but opposite direction are flowing in the upper interdigital coupling elements 26a and 28a, an odd mode impedance designated $Z_{oo}$ exists between each element and ground. The even and odd mode impedances for a coupled pair of lines are given by the equations:

$$Z_{oo} = Z_0 \sqrt{\frac{1-c}{1+c}} \quad (1)$$

$$Z_{oe} = Z_0 \sqrt{\frac{1+c}{1-c}} \quad (2)$$

where C is the coupling factor and $Z_o$ is the characteristic impedance of the transmission line to which the coupler 20 is connected (i.e., conductive traces 62–68). Equations (1) and (2) show the functional relationship between the coupling factor C and the even and odd mode impedances $Z_{oe}$ and $Z_{oo}$. In designing the coupler 20, a desired coupling factor C is selected (e.g., 3 dB). From the selected coupling factor C, equations (1) and (2) yield the even and odd mode impedance $Z_{oe}$ and $Z_{oo}$ required to achieve that coupling factor. The required even and odd mode impedances $Z_{oe}$ and $Z_{oo}$ must also satisfy the relationship $Z_o = (Z_{oe} Z_{oo})^{1/2}$ as known in the art in order to satisfy impedance matching requirements.

Equations (1) and (2) assume the phase velocities of the waves associated with both the even and odd mode impedances $Z_{oe}$ and $Z_{oo}$ are equal. When these phase velocities are not equal, the specific phase velocity of each mode must be used to determine the associated impedance. If not, the bandwidth and directivity of the directional coupler are adversely affected by the differing phase velocities.

FIGS. 5 and 6 illustrate the cause of the differing phase velocities. The general equation for the phase velocity is:

$$V_p = C/(\epsilon_{eff})^{1/2} \quad (3)$$

where c is the speed of light in free space (i.e., $3 \times 10^8$ meters/sec.) and $\epsilon_{eff}$ is the effective permittivity of the medium in which the electric field is propagating. As shown in FIG. 5, the electric field 86 associated with the even mode impedance $Z_{oe}$ propagates partly in the coupler dielectric board 22 and partly in air 88. As a result, the effective permittivity $\epsilon_{eff}$ is somewhere between the permittivity of free space $\epsilon_o$ and the relative permittivity $\epsilon_r$ of the dielectric board 22. The effective permittivity $\epsilon_{eff}$ for the even mode impedance $Z_{oe}$, however, is different than that for odd mode impedance $Z_{oo}$ as illustrated in FIG. 6. The electric field 90 associated with the odd mode impedance $Z_{oo}$ primarily propagates in the dielectric board 22 and will accordingly have an effective permittivity $\epsilon_{eff}$ which is closer to the relative permittivity $\epsilon_r$ of the dielectric board.

The equations for the even and odd mode impedances $Z_{oe}$ and $Z_{oo}$ as functions of associated phase velocity are:

$$Z_{oo} = 1/(V_{po} \times C_{oo}) \quad (4)$$

$$Z_{oe} = 1/(V_{pe} \times C_{oe}) \quad (5)$$

where $V_{po}$ is the phase velocity associated with the odd mode impedance $Z_{oo}$, $V_{pe}$ the phase velocity associated with the even mode impedance $Z_{oe}$, $C_{oo}$ the effective capacitance per unit length of one line to ground for the odd mode impedance, and $C_{oe}$ the effective capacitance per unit length of one line to ground for the even mode impedance.

The present invention compensates for the differing phase velocities by equalizing the propagation delays of each mode. To equalize the propagation delays, the wave associated with the even mode impedance $Z_{oe}$ is caused to meander around the gap created by the teeth 40, 42, 56, and 58 forming the interdigitated patterns. The propagation delay to the wave associated with the even mode impedance $Z_{oe}$ is a function of the number or periodicity of the teeth.

In practice, equations (4) and (5) cannot be used directly to determine $Z_{oo}$ and $Z_{oe}$ since the phase velocities $V_{po}$ and $V_{pe}$ cannot be easily measured. Instead, the capacitances $C_{oo}$ and $C_{oe}$ must be determined by modeling, mapping, measuring, or calculating. Thereafter, the determined capacitances $C_{oo}$ and $C_{oe}$ are used to approximate the odd and even impedances $Z_{oo}$ and $Z_{oe}$. The phase velocities are then adjusted by varying the physical layout of the interdigitated pattern until the required $Z_{oe}$ and $Z_{oe}$ are realized to obtain the desired coupling factor C.

An embodiment of the directional coupler 20 in accordance with the present invention above was built and tested. The physical parameters of this embodiment were as follows:

| | |
|---|---|
| Mean length of upper interdigital coupling elements | 58.6 mm |
| Length of lower interdigital coupling elements | 46.0 mm |
| Width of teeth | 1.0 mm |
| Spacing of teeth | 2.5 mm |
| Total thickness of foil forming coupling elements | .038 mm |
| Coupler dielectric board thickness | .813 mm |
| Coupler dielectric board constant | 2.5 |
| Coupler dielectric board dissipation factor | .0025 at 10 GHz |

The coupler dielectric board 22 in this embodiment was made from a woven glass/PTFE composite.

Figure 7:
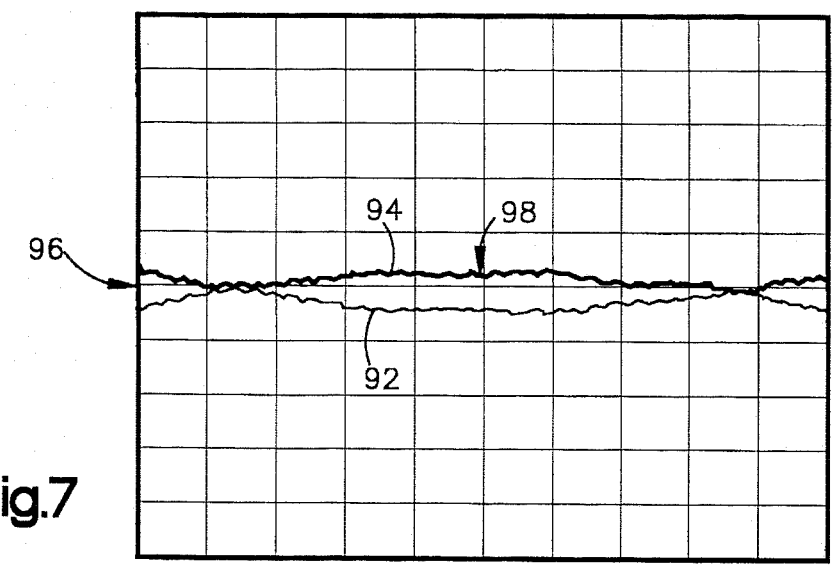
FIG. 7 is a plot showing the power output from the coupled ports of the microwave directional coupler as a function of frequency.
Figure 8:
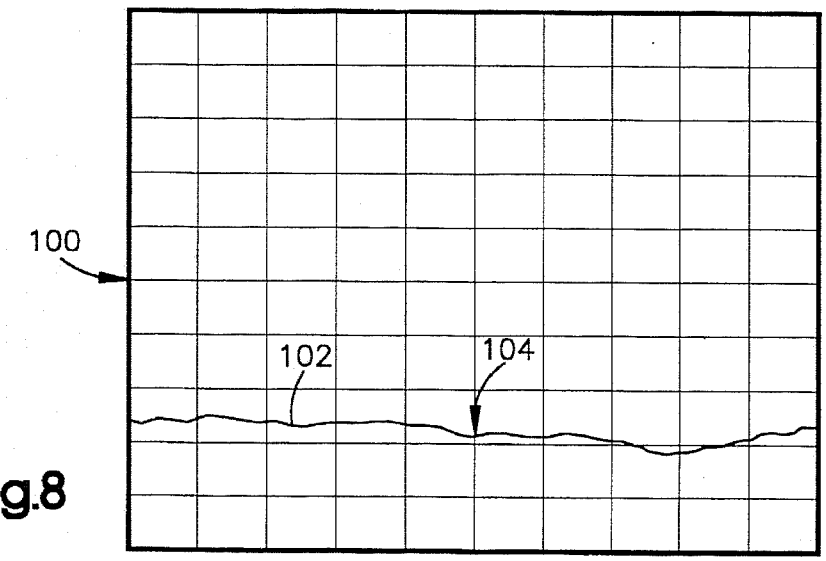
FIG. 8 is a plot showing the input return loss of the microwave directional coupler as a function of frequency.
Figure 9:
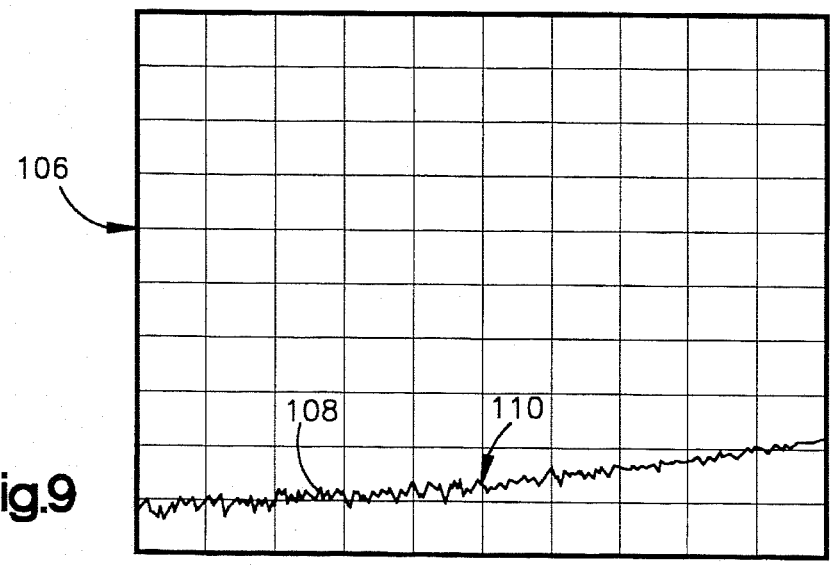
FIG. 9 is a plot showing the isolation of the microwave directional coupler as a function of frequency.

The test results of the preferred embodiment are shown in FIGS. 7 to 9. In FIG. 7, lines 92 and 94 are plots which show the output from Ports 2 and 3, respectively, when a signal is input to Port 1 and Port 4 is terminated in a matched load. The vertical axis represents power, with each vertical division being 1 dB. The horizontal axis represents frequency and goes from 450 MHz to 950 MHz. The arrow 96 shows the half power or –3 dB reference level. Over the entire 500 MHz frequency range, the graph of FIG. 7 shows good performance of the coupler 20. The power input to Port 1 is coupled approximately one half into Port 2 and one half into Port 3. At the center frequency of 700 MHz, indicated by the arrow 98, the power in Port 3 is approximately –2.76 dB while the power in Port 2 is approximately –3.45 dB.

FIG. 8 shows that the coupler 20 exhibits good input return loss. In FIG. 8, the vertical axis once again represents power and the horizontal axis frequency. Each vertical division represents 10 dB and the arrow 100 is the 0 dB reference level. The line 102 is a plot of reflected power resulting from an input signal into one of the coupler 20 ports when the other three ports are terminated in matched loads. Ideally, the reflected power should be zero with this configuration. Over the entire frequency range, the line 102 shows the reflected power is at a level of approximately –25 dB or less. At the center frequency of 700 MHz, the reflected power level is –27.917 dB as shown by the arrow 104.

FIG. 9 shows that the coupler 20 exhibits good isolation and therefore directivity over the relevant frequency range. The vertical axis is again power with each vertical division being 10 dB. The horizontal axis is again frequency. The arrow 106 is the 0 dB reference level. The line 108 is a plot of the power output from Port 4 when a signal is input to Port 1 and Ports 2 and 3 are terminated in matched loads. Recall that ideally Ports 1 and 4 are isolated, meaning that no power is coupled from Port 1 to Port 4 (i.e., infinite directivity). At the center frequency of 700 MHz, shown by the arrow 110, the power in Port 4 is at approximately –47.015 dB. Over the entire frequency range, line 108 shows the power in Port 4 is at a level of –38 dB or less, which is excellent isolation and directivity for such a coupler.

From the above description of the invention, those skilled in the art will perceive improvements, changes and modifications. Such improvements, changes and modifications within the skill of the art are intended to be covered by the appended claims.

Having described the invention, we claim the following:

1. A microwave directional coupler, comprising:

a parent circuit board having opposing surfaces;

a coupler dielectric board having opposing surfaces and mounted on said parent circuit board with the opposing surfaces thereof substantially perpendicular to one of the opposing surfaces of said parent circuit board;

first and second upper interdigital electrically conductive elements respectively disposed on the opposing surfaces of said coupler dielectric board, said upper interdigital electrically conductive elements being electrically coupled together to cause said coupler to exhibit an odd mode impedance having a value that varies as a function of the coupling; and first and second lower interdigital electrically conductive elements respectively disposed on the opposing surfaces of said coupler dielectric board, each of said lower interdigital electrically conductive elements being spaced from the respective upper interdigital electrically conductive element, said lower interdigital electrically conductive elements and said upper interdigital electrically conductive elements being electrically coupled together to cause said coupler to exhibit an even mode impedance having a value that varies as a function of the coupling between said lower interdigital electrically conductive elements and said upper interdigital electrically conductive elements.

2. A microwave directional coupler as recited in claim 1 wherein said first and second upper interdigital electrically conductive elements are symmetrical.

3. A microwave directional coupler as recited in claim 1 wherein said first and second lower interdigital electrically conductive elements are symmetrical.

4. A microwave directional coupler as recited in claim 1 wherein said coupler dielectric board has a permittivity $\epsilon_r$, said parent circuit board has a permittivity $\epsilon$, and the values of the permittivities $\epsilon_r$ and $\epsilon$ are not equal.

5. A microwave directional coupler as recited in claim 1 including means for electrically connecting said first and second lower interdigital electrically conductive elements to ground potential.

6. A microwave directional coupler as recited in claim 1 wherein said first and second upper interdigital electrically conductive elements have unequal widths.

7. A microwave directional coupler as recited in claim 1 having a desired operating frequency and wherein said first and second upper and lower interdigital electrically conductive elements have lengths that are scaled as a function of the desired operating frequency.

8. A microwave directional coupler, comprising:

a parent circuit board having opposing surfaces;

a coupler dielectric board having opposing surfaces and mounted on said parent circuit board with the opposing surfaces thereof substantially perpendicular to one of the opposing surfaces of said parent circuit board;

first and second upper interdigital electrically conductive elements respectively disposed on the opposing surfaces of said coupler dielectric board, said upper interdigital electrically conductive elements having a straight top edge and a bottom edge having a plurality of teeth disposed thereon, said upper interdigital electrically conductive elements being electrically coupled together to cause said coupler to exhibit an odd mode impedance having a value that varies as a function of the coupling; and first and second lower interdigital electrically conductive elements respectively disposed on the opposing surfaces of said coupler dielectric board, each of said lower interdigital electrically conductive elements being spaced from the respective upper interdigital electrically conductive element, said lower interdigital electrically conductive elements having a straight bottom edge and a top edge having a plurality of teeth disposed thereon with the teeth interdigitated with the teeth disposed on the respective bottom edges of said upper interdigital electrically conductive elements, said lower interdigital electrically conductive elements and said upper interdigital electrically conductive elements being electrically coupled together to cause said coupler to exhibit an even mode impedance having a value that varies as a function of the coupling between said lower interdigital electrically conductive elements and said upper interdigital electrically conductive elements.

9. A microwave directional coupler as recited in claim 8 wherein the number of teeth disposed on the bottom edge of said upper interdigital electrically conductive elements is an even number.

10. A microwave directional coupler as recited in claim 8 wherein the number of teeth disposed on the top edge of said lower interdigital electrically conductive elements is an odd number.

11. A microwave directional coupler as recited in claim 8 wherein said first and second upper interdigital electrically conductive elements are symmetrical.

12. A microwave directional coupler as recited in claim 8 wherein said first and second lower interdigital electrically conductive elements are symmetrical.

13. A microwave directional coupler as recited in claim 8 wherein said coupler dielectric board has a permittivity $\epsilon_r$, said parent circuit board has a permittivity $\epsilon$, and the values of the permittivities $\epsilon_r$ and $\epsilon$ are not equal.

14. A microwave directional coupler as recited in claim 8 including means for electrically connecting said first and second lower interdigital electrically conductive elements to ground potential.

* * * * *